United States Patent [19]

Hinterlechner

[11] Patent Number: 4,866,976
[45] Date of Patent: Sep. 19, 1989

[54] APPARATUS FOR THE METAL WORKING OF COMPONENTS

[75] Inventor: Gerhard Hinterlechner, Weinheim, Fed. Rep. of Germany

[73] Assignee: AATEC Assembling-Automations Technik GmbH, Pforzheim, Fed. Rep. of Germany

[21] Appl. No.: 227,453

[22] Filed: Aug. 2, 1988

Related U.S. Application Data

[63] Continuation of Ser. No. 941,286, Dec. 12, 1986, abandoned.

[30] Foreign Application Priority Data

Dec. 13, 1985 [DE] Fed. Rep. of Germany ....... 3544087

[51] Int. Cl.⁴ .............................................. B21D 37/12
[52] U.S. Cl. ...................................... 72/456; 72/407; 83/623; 83/567; 83/387; 29/827
[58] Field of Search ................. 72/482, 384, 407, 455, 72/456, 408; 83/386, 387, 567, 668; 29/412, 827

[56] References Cited

U.S. PATENT DOCUMENTS

| | | | |
|---|---|---|---|
| 1,533,681 | 4/1925 | Witkus | 83/387 |
| 1,757,828 | 5/1930 | Beckert | 83/623 |
| 2,039,251 | 4/1936 | Knight | 83/567 |
| 2,148,248 | 2/1939 | Swangren | 83/387 |
| 2,296,136 | 9/1942 | Bechtel | 83/567 |
| 2,411,399 | 11/1946 | Walpole | 83/387 |
| 3,266,352 | 8/1966 | Kuts | 83/623 |
| 3,739,669 | 6/1973 | Seki | 83/623 |
| 3,763,827 | 6/1973 | Hof | 83/623 |
| 3,771,396 | 11/1973 | Im | 83/623 |
| 4,531,285 | 7/1985 | Lucas | 29/827 |

Primary Examiner—David Jones
Attorney, Agent, or Firm—Bachman & LaPointe

[57] ABSTRACT

An apparatus for removing tie bars from between the leads of a semiconductor device during the manufacture of said device comprises a punch guide having a plurality of guide slots and a die block aligned with and spaced from the punch guide so as to provide a space therebetween. The die block is provided with a plurality of die slots which are in axial alignment with the plurality of guide slots in the punch guide. A plurality of punches are axially aligned with the guide slots and the die slots. A transmission mechanism is provided for selectively moving the die block toward the punch guide and the plurality of punches toward the die block such that the punches pierce the space between the die block and punch guide for removing the tie bars from between the leads.

13 Claims, 3 Drawing Sheets

APPARATUS FOR THE METAL WORKING OF COMPONENTS

This is a continuation of co-pending application Ser. No. 941,286 filed on Dec. 12, 1986, now abandoned.

BACKGROUND OF THE INVENTION

The invention relates to a tooling system for operations like stamping, piercing, cutting, bending or forming work on electronic, electromechanical or mechanical components, particularly for removing the tie bars between leads which are present during the manufacture of semiconductor devices using a die block and punches cooperating with said die block.

When manufacturing in particular electronic components and more especially integrated circuits, the leads are connected through the package by an enveloping or moulding process. The individual leads are connected together by means of tie bars, which form a limitation for the plastic compound flowing between the leads. These tie bars must be subsequently removed, because they are generally made from the same conductive material as the leads.

For this purpose, it has hitherto been standard practice to place the thus manufactured integrated semiconductor circuits on a die in an accurately positioned manner, followed by the lowering of a punch. This punch has a plurality of comb tooth-like projections, which are introduced between the leads and punch out the tie bars. The tools have hitherto been guided by using of die sets or sliding or roller guides integrated into the tool with circular guide pillars and bushes. It is necessary to accurately guide the die and punch, i.e. for example only a total alignment deviation between the punch and die of a few micrometers is permitted. In hitherto designed tools, more than ten tolerances of tool parts like die inserts, die block, die retainer, dowel holes and pins, position of leader pins and bushings, punch guides and guide inserts etc. accumulate in unloaded condition to the misalignment of punches to the die and furthermore the guiding clearance and misalignment and deformations occuring in the tool under the high forces applied during operation (punching process) add up to the total misalignment of the punches to the die. A high precision guidance is not possible with the aforementioned known tools.

The known tools suffer from the further disadvantage that it is necessary to move and decelerate relatively large masses, which reduces the speed with which the tools work when using mechanical presses.

The goal of the new invention is to develop a tooling system which has a long service life, in which the die and punch are extremely accurately guided and which operates at a high speed.

SUMMARY OF THE INVENTION

According to the invention this problem is solved in that both the die block and the punch guide or the punches are arranged so as to be movable contrary (in the "X" and "Y" directions) on only one common reference plane of a reference block.

Such tools are generally suitable for stamping, piercing, coining, bending, cutting and forming operations. The moving masses are reduced as a result of this mounting support and guiding construction, so that the tools can be operated at much higher speed, than the tools hitherto used. The extremely accurate guidance is in particular obtained by means of the reference block. Therefore the latter must have a very accurate external shape or cross-section. However, the manufacture of such a reference block is, as experience has shown, much easier to obtain than a permanently accurate guidance with column guides. The combined tolerances are reduced to a few parts, namely the die and the punch guide only.

In order to improve the guidance of the die block or punch guide on the reference block, a sliding or antifriction bearing and preferably a roller bearing is provided. The die block and punch guide are placed in a precise housing, which is formed from the reference block, head or top and side guide plates. This forced guidance of the die block and punch guide on the reference plane of the reference block reduces the number of cooperating parts and so the number of added tolerances for the accuracy of the alignment.

In individual cases, an additional wedge can be placed below the head plate of the housing and which as a result of the wedge-like construction can adjust the distance or space for guiding the die block or punch guide in a very small tolerance range, which ensures that the same mounting or guidance of the die block or punch guide on the reference block is always respected and that it is possible to adjust a bearing preloading in the case of roller bearings.

The die block may have reception slots for punches, and the scrap said slots preferably issuing into a chamber in the interior of the die block to which can be connected an extraction device. If tie bars are stamped out by the punches between the leads and inserted in the said slots, it is possible to easily eliminate the same in this way.

The punch guide can comprise a one-piece block or a block with interchangeable inserts. However, preferably the punch guide has guide slots, in which punches are slidably mounted.

The combination or individual punches are fixed in the head block according to the present invention. In this case, the head block is also placed on roller or sliding bearings in a housing, so that it can be moved together with the punch guide in the direction "Y". It is also then possible to provide mechanical force accumulators or springs in the punch guide and/or head block, which permits a return of the punches into the protected position in the guide slots, but counter to the force thereof the punches can be extended into the closed position. They are also used for stripping the leads following the stamping or punching process.

A number of movements mechanisms are conceivable for the movement of the die block and punch guide or head block in the "X" or "Y" direction. The movement mechanism described hereinafter only constitutes an exemplified embodiment. The movement therein takes place by means of two cams, which operate two levers, which are tiltable about their rotation axes. The die block and punch guide or head block perform a gentle movement controlled by the cams and which is formed from a limited stroke or travel.

The invention leads to an accuracy representing a accuracy of alignment within a few micrometers. The speed at which the means operates is approximately five strokes per second.

Further modules for additional operations, such as forming, coining, deep-drawing and the like can be additionally incorporated into the means in this way.

BRIEF DESCRIPTION OF THE DRAWINGS

Further advantages features and details of the invention can be gathered from the following description of preferred embodiments relative to the drawings, wherein show.

DETAILED DESCRIPTION

Figure 1:
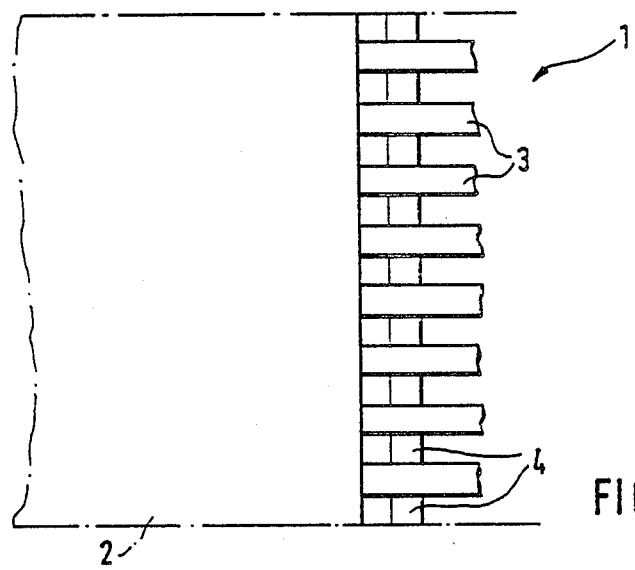
FIG. 1, a detail of an integrated semiconductor circuit as an example of an electronic device.

According to FIG. 1, a semiconductor device 1 essentially comprises a plastic package 2 with marginally shaped on, generally metallic leads or connectors 3. Between said leads 3 is provided a tie bar 4 which, during the moulding process of leads 3 and plastic package 2, forms a boundary for the plastic compound flowing in between leads 3. For manufacturing reasons, said tie bars 4 are generally made from the same conductive material as leads 3. However, as a result they would produce a short circuit between the individual leads 3, so that they must be removed prior to any further working of the integrated semiconductor circuits.

Figure 2:
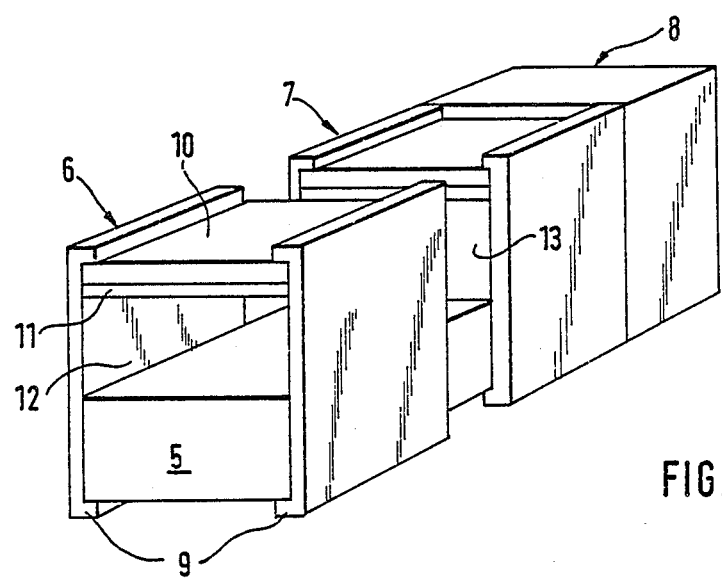
FIG. 2, a perspective view of the basic elements of the inventive means for working electronic components.

An apparatus for working the integrated semiconductor circuit shown in FIG. 1 is provided, according to FIG. 2, with a guidance or reference block 5, which traverses three housings 6, 7, 8. Housing 6 receives a die block, housing 7 a punch guide and housing 8 an additional head block. Housings 6, 7 and 8 have clip-like side plates, which engages under the reference block 5 and project over a head plate 10. A further wedge 11 can be arranged beneath the head plate 10.

Figure 3:
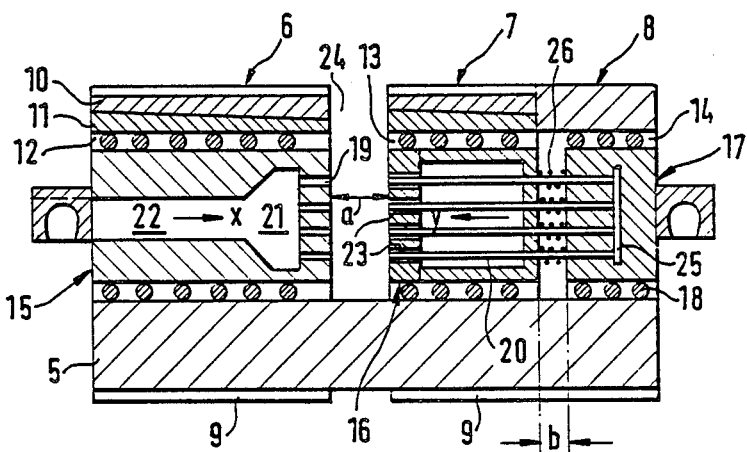
FIG. 3, a longitudinal section through the inventive means for working electronic components.

In all three housings 6, 7 and 8 reception spaces 12, 13, 14 for the moving elements of the inventive means are formed by reference block 5, side plate 9 and wedges 11. Space 12 serves to receive a die block 15, space 13 a punch guide 16 and space 14 a head block 17. Die block 15, punch guide 16 and optionally head block 17 are guided on all sides between rollers 18. However, in order not to overburden FIG. 3, only the upper and lower rollers are indicated therein, whilst the lateral rollers are not shown.

The die block 15 or optionally the interchangeable insert has reception or die slots 19, which can be entered during the punching process by punches 20 from punch guide 16. In the present embodiment said slots 19 issue into a chamber 21, to which is connected an extraction channel 22 for extracting cut out tie bars 4.

Punches 20 are guided in guide slots 23 in the punch guide 16. To increase precision, the guide slots 23 and die slots 19 are preferably manufactured together in one operation. Between the end face of die block 15 with die slots 19 and the end face of punch guide 16 with guide slots 23 is formed a tool daylight 24 having the width "a" for receiving the workpiece guide (semiconductor guide) and for the supply of e.g. integrated semiconductor circuits 1.

Punches 20 are guided from punch guide 16 into head block 17, where they are fixed by a punch plate 25. In the inoperative position, a force accumulator or spring 26 maintains a spacing b between punch guide 16 and head block 17.

During the punching process the die block 15 is guided in direction X and punch guide 16 or head block 17 in direction Y. The die block and then the punch guide 16 encounter a semiconductor device 1 guided in the tool daylight 24, so that the device is accurately positioned. The head block 17 moves on in direction Y and reduces the spacing b with respect to the force of accumulator 26. This leads to the punches 20 being moved out of the guide slots 23, the tie bars are separated from leads 3 and slide, optionally with the tie bars 4, into the die slots 19. Punch guide 16, head block 17 and then the die block 15 are moved apart counter to direction X or Y, so that once again tool daylight 24 is formed and a new semiconductor device 1 to be worked can be introduced.

Figure 4:
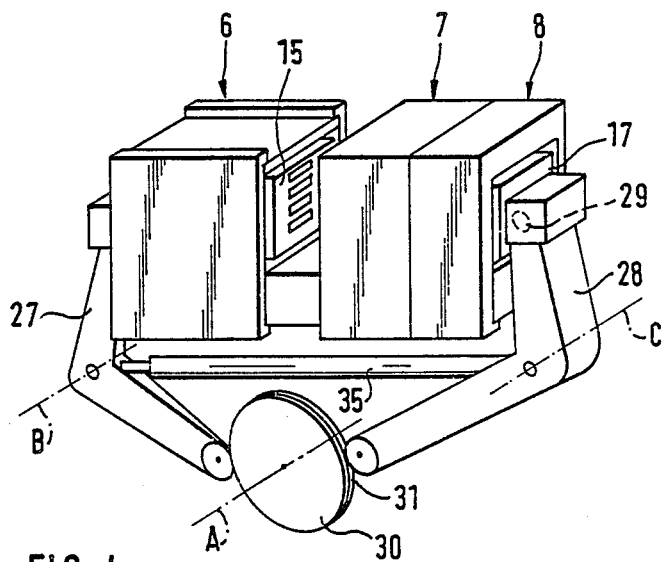
FIG. 4, a perspective view of the means according to FIG. 3 with a diagrammatically represented movement mechanism.

FIG. 4 gives and example for the movement of die block 15, punch guide 16 and head block 17. Levers 27, 28 are in each case connected to the die block 15 and head block 17, said connection taking place by means of adapters 29. Opposite to adapter 29, levers 27 or 28 engage on two cams or cam disks 30, 31, which rotate about an axis a. On running off cams 30, 31, levers 27 or 28 rotate about their rotation axes b and c located in the vicinity of the knee or elbow. Therefore the die or head block 15, 17 respectively is displaced in direction X or Y, so that the particular adapter 29 has sufficient clearance not to restrict the movement clearance of lever 27 or 28. The resetting of levers 27 or 28 on cam 30 can be assisted by force accumulators or springs 32. It is also possible to assist the return movement of die block 15 or head block 17 in direction X or Y by additional pressure members. However, resetting can also take place by means of cams or cam disks.

Figure 5:
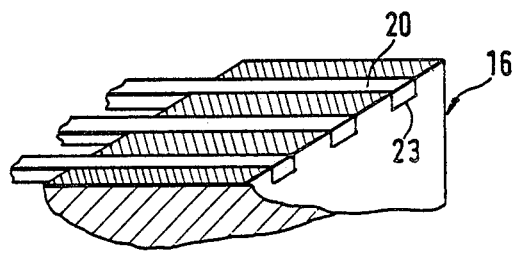
FIG. 5, a perspective view of a detail from part of the means according to FIG. 3 showing how the punches (20) are guided in the guide slots (23) of the punch guide (16).
Figure 6:
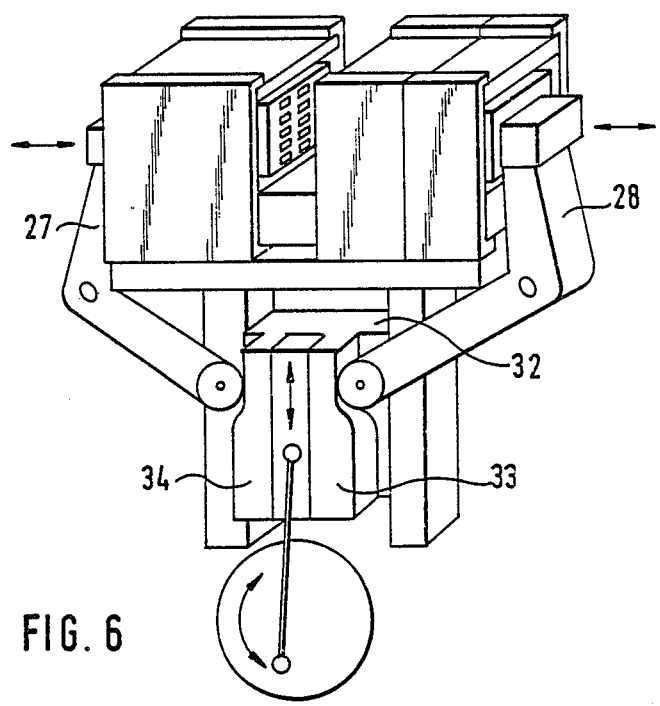
FIG. 6, a perspective view of another embodiment.

FIGS. 5 and 6 show enlarged guide slots 23 and individual punches 20 guided therein. In the case of the embodiment shown in FIG. 6 levers 27, 28 are driven by means of a cam stick 32, which has cams or cam disks 33, 34. The various movement directions are indicated by arrows.

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

I claim:

1. An apparatus for use in a stamping operation comprising a reference block having a surface defining a reference plane; a die block movably mounted on said reference block for movement along said surface defining said reference plane, said die block having at least one die slot; at least one punch movably mounted on said reference block for movement along said surface defining said reference plane such that said at least one punch is axially aligned with and spaced from said at least one die slot; and moving means for simultaneously moving said die block and said at least one punch along said surface defining said reference plane on said reference block whereby said die block moves towards said at least one punch and said at least one punch moves towards said die block during the stamping operation.

2. An apparatus according to claim 1 wherein bearings are provided between said die block and said reference block and said punch guide and said reference block.

3. An apparatus according to claim 2 wherein said die block, said punch guide and said reference block are mounted within a housing wherein said die block and said punch guide are supported on all sides by bearings.

4. An apparatus according to claim 3 wherein the housing engages the reference block with clip-like side plates for holding said reference block, said die block and said punch guide together.

5. An apparatus according to claim 4 wherein a head plate is provided above said die block and said punch guide wherein the housing engages over said head plate, said head plate comprises a pair of wedge-shaped elements which allow for the precise adjustment of the distance between the die plate and the reference block and the punch guide and the reference block for preloading the bearings.

6. An apparatus according to claim 1 further comprising a punch guide having at least one guide slot axially aligned with and spaced from said at least one die slot for receiving said at least one punch, said punch guide being movably mounted by said moving means on said reference block for movement towards said die block.

7. An apparatus according to claim 1 including a plurality of guide slots, a plurality of die slots and a plurality of punches.

8. An apparatus according to claim 7 wherein said plurality of punches are mounted in a head block upstream of said punch guide wherein said moving means moves said head block relative to said punch guide such that said plurality of punches move within said plurality of guide slots.

9. An apparatus according to claim 8 including housing means wherein said punch guide, said die block and said head block are mounted on bearings within said housing means for movement relative thereto.

10. An apparatus according to claim 8 wherein spring means are provided between said head block and said punch guide.

11. An apparatus according to claim 8 wherein said moving means comprises a pair of levers having opposed ends wherein one end of each of said levers is secured to said die block and said head block.

12. An apparatus according to claim 11 wherein said levers are pivotably mounted and said moving means further comprises at least one rotatable cam for driving the other end of said levers for moving said die block and said head block.

13. An apparatus according to claim 12 wherein a plurality of cams are arranged on a common shaft.

* * * * *